(12) United States Patent
Siddhant et al.

(10) Patent No.: US 11,804,824 B2
(45) Date of Patent: Oct. 31, 2023

(54) DUAL MODE STRUCTURE (DMS) FILTER LADDER DESIGN

(71) Applicant: RF360 EUROPE GMBH, Munich (DE)

(72) Inventors: Sahoo Siddhant, Singapore (SG); Kamran Cheema, Apopka, FL (US)

(73) Assignee: RF360 Singapore Pte. Ltd., San Diego, CA (US)

( * ) Notice: Subject to any disclaimer, the term of this patent is extended or adjusted under 35 U.S.C. 154(b) by 533 days.

(21) Appl. No.: 17/095,294

(22) Filed: Nov. 11, 2020

(65) Prior Publication Data

US 2022/0149819 A1  May 12, 2022

(51) Int. Cl.
*H03H 9/64* (2006.01)
*H03H 9/145* (2006.01)
*H03H 9/25* (2006.01)
*H03H 9/02* (2006.01)

(52) U.S. Cl.
CPC ...... *H03H 9/6483* (2013.01); *H03H 9/02543* (2013.01); *H03H 9/02637* (2013.01); *H03H 9/145* (2013.01); *H03H 9/25* (2013.01)

(58) Field of Classification Search
CPC ............ H03H 9/02; H03H 9/145; H03H 9/25; H03H 9/64
See application file for complete search history.

(56) References Cited

U.S. PATENT DOCUMENTS

| | | | | |
|---|---|---|---|---|
| 7,446,629 B2 * | 11/2008 | Nakamura | ......... | H03H 9/14588 333/133 |
| 8,179,211 B2 * | 5/2012 | Bauer | ................ | H03H 9/14597 333/195 |
| 9,112,478 B2 * | 8/2015 | Moriya | .................. | H03H 9/725 |
| 9,148,115 B2 * | 9/2015 | Yabuuchi | ................. | H03H 9/70 |
| 9,825,612 B2 * | 11/2017 | Kawachi | ........... | H03H 9/02574 |

* cited by examiner

*Primary Examiner* — Andrea Lindgren Baltzell
*Assistant Examiner* — Alan Wong
(74) *Attorney, Agent, or Firm* — Patterson + Sheridan LLP

(57) ABSTRACT

Certain aspects of the present disclosure provide a filter. The filter generally includes a series resonator coupled between a first port of the filter and a second port of the filter, and a shunt resonator coupled between a node of the filter and a reference potential node of the filter, the node being coupled between the first port and the second port. The shunt resonator typically includes a first piezoelectric substrate, a first plurality of reflectors disposed above the first piezoelectric substrate, and a first plurality of interdigital transducers (IDTs) disposed above the first piezoelectric substrate and between the first plurality of reflectors, wherein the shunt resonator is configured as a dual mode structure (DMS).

30 Claims, 8 Drawing Sheets

DUAL MODE STRUCTURE (DMS) FILTER LADDER DESIGN

TECHNICAL FIELD

Certain aspects of the present disclosure generally relate to electronic components and, more particularly, a radio frequency (RF) filter.

BACKGROUND

Electronic devices include traditional computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system or a New Radio (NR) system).

Wireless communication transceivers used in these electronic devices generally include multiple radio frequency (RF) filters for filtering a signal for a particular frequency or range of frequencies. Electroacoustic devices (e.g., acoustic filters) are used for filtering high-frequency (e.g., generally greater than 100 MHz) signals in many applications. Using a piezoelectric material as a vibrating medium, acoustic resonators operate by transforming an electrical signal wave that is propagating along an electrical conductor into an acoustic wave that is propagating via the piezoelectric material. The acoustic wave propagates at a velocity having a magnitude that is less than that of the propagation velocity of the electromagnetic wave. Generally, the magnitude of the propagation velocity of a wave is proportional to a size of a wavelength of the wave. Consequently, after conversion of an electrical signal into an acoustic signal, the wavelength of the acoustic signal wave is smaller than the wavelength of the electrical signal wave. The resulting smaller wavelength of the acoustic signal enables filtering to be performed using a smaller filter device. Reducing the size of such acoustic filters is desirable.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure provide a filter. The filter generally includes a series resonator coupled between a first port of the filter and a second port of the filter, and a shunt resonator coupled between a node of the filter and a reference potential node of the filter, the node being coupled between the first port and the second port. The shunt resonator typically includes a first piezoelectric substrate, a first plurality of reflectors disposed above the first piezoelectric substrate, and a first plurality of interdigital transducers (IDTs) disposed above the first piezoelectric substrate and between the first plurality of reflectors, wherein the shunt resonator is configured as a dual mode structure (DMS).

Certain aspects of the present disclosure provide a filter. The filter generally includes a series resonator coupled between a first port of the filter and a second port of the filter, and a shunt resonator coupled between a node of the filter and a reference potential node of the filter, the node being coupled between the first port and the second port. In some aspects, the shunt resonator is configured as a DMS.

Certain aspects of the present disclosure provide a method of filtering an input signal. The method generally includes receiving the input signal at a first port of a filter, and generating a filtered version of the input signal at a second port of the filter. The filter typically includes a series resonator coupled between the first port of the filter and the second port of the filter, and a shunt resonator coupled between a node of the filter and a reference potential node of the filter, the node being coupled between the first port and the second port. The shunt resonator includes a first piezoelectric substrate, a first plurality of reflectors disposed above the first piezoelectric substrate, and a first plurality of IDTs disposed above the first piezoelectric substrate and between the first plurality of reflectors. In some aspects, the shunt resonator is configured as a DMS.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to a filter implemented with a dual mode structure (DMS). As will be described in more detail herein, a filter circuit may be implemented with a DMS (e.g., implemented as a coupled resonator filter) as a shunt resonator in combination with a filter implemented with a DMS as a series resonator. The shunt resonator may have a DMS by including multiple interdigitated transducers (IDTs) between two reflectors, where adjacent IDTs may be electroacoustically coupled. Implementing the shunt resonator using a DMS provides for dual resonance modes and reduces a size of the filter while providing improved attenuation in the band-stop frequency range, as compared to other implementations.

Example Wireless Communications

Figure 1:
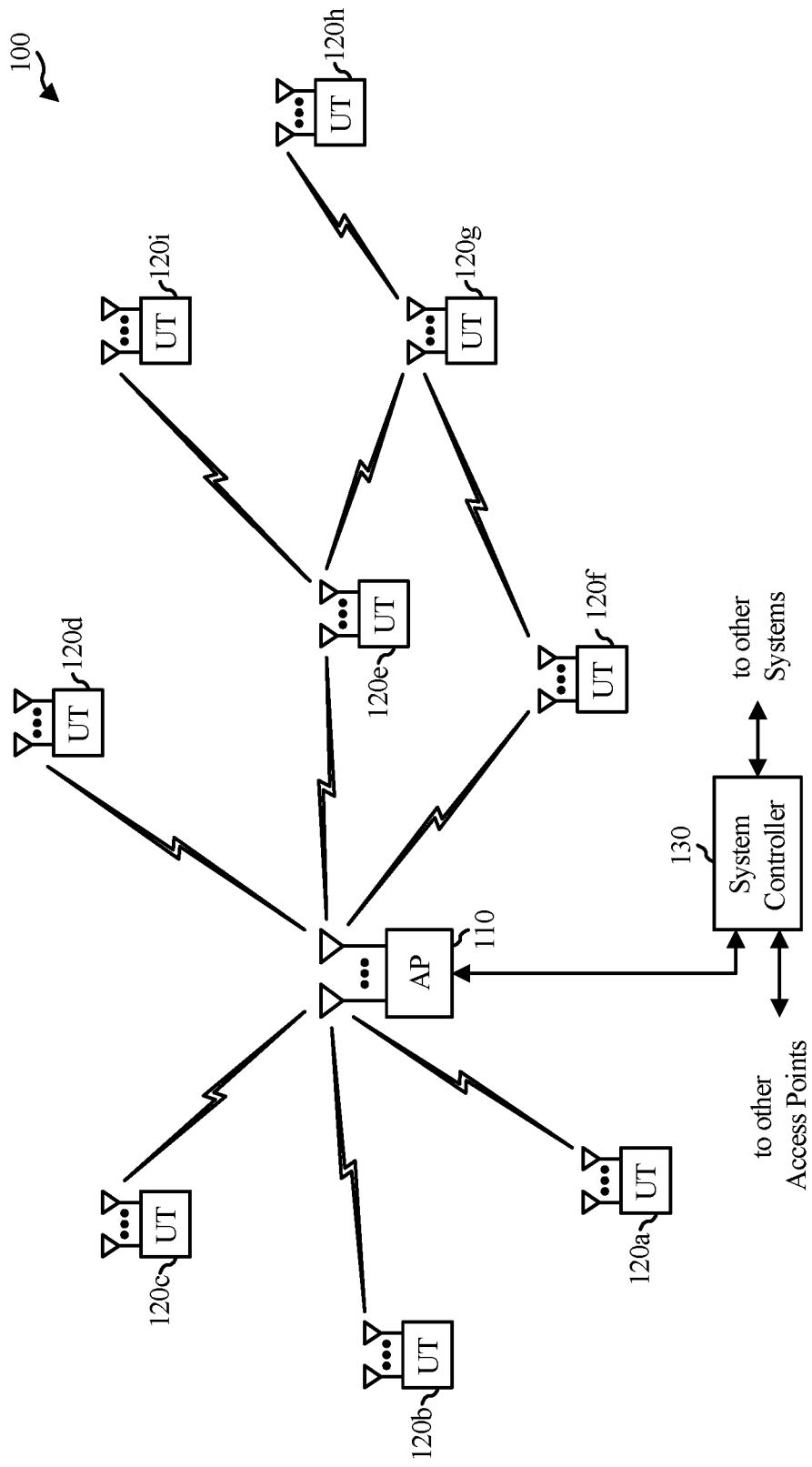
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported).

In some aspects, the user terminal 120 or access point 110 may include multiple RF chips for transmission and reception of signals for various applications. The multiple chips may include one or more filters implemented with a DMS as a shunt impedance element in combination with a filter implemented with a DMS as a series impedance element.

Figure 2:
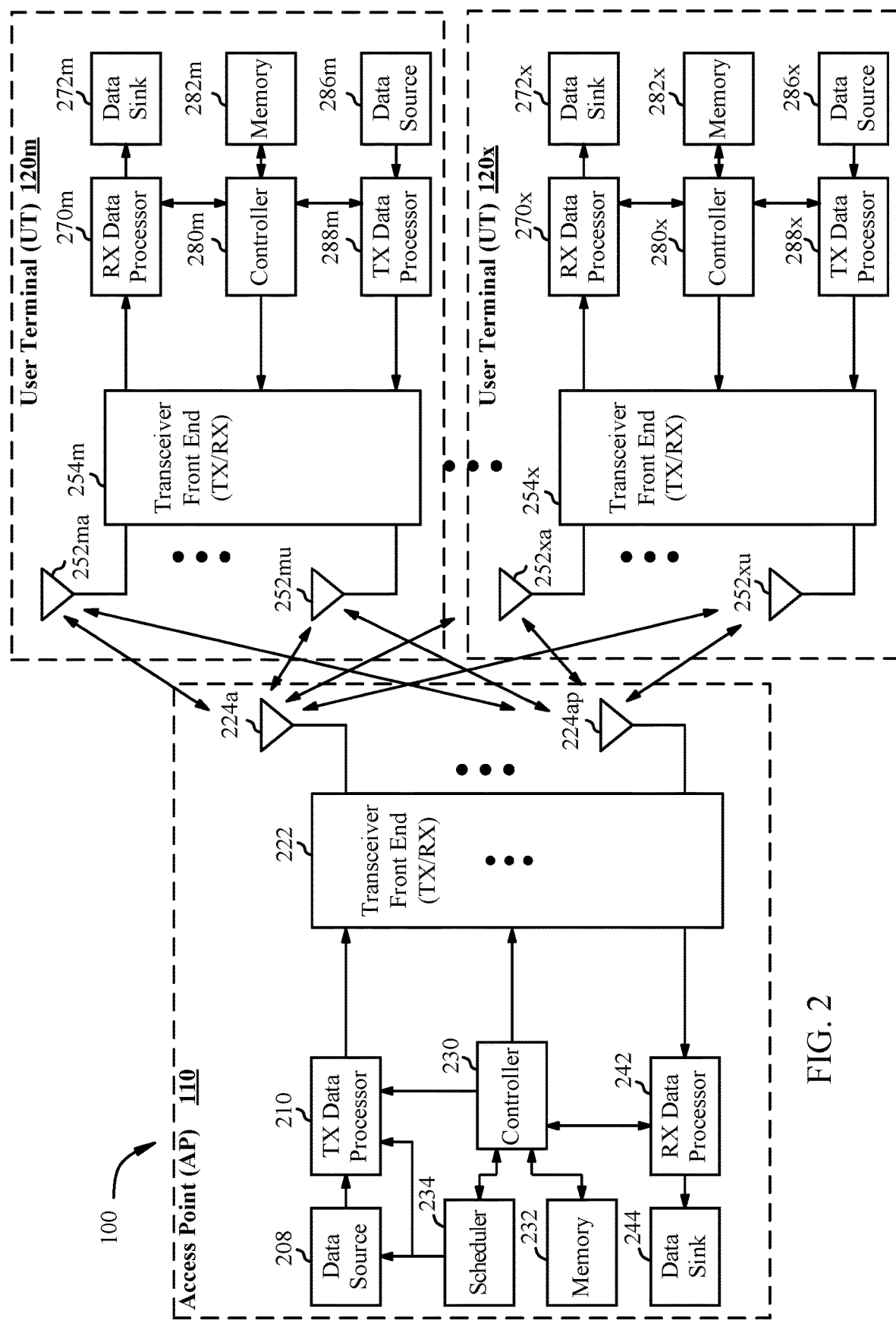
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

In some aspects, the transceiver front end 254 or 222 may include multiple RF chips for transmission and reception of signals for various applications. The multiple chips may include one or more filters implemented with a multi-element filter implemented with a DMS as a shunt impedance element in combination with a multi-element filter implemented with a DMS as a series impedance element.

Figure 3:
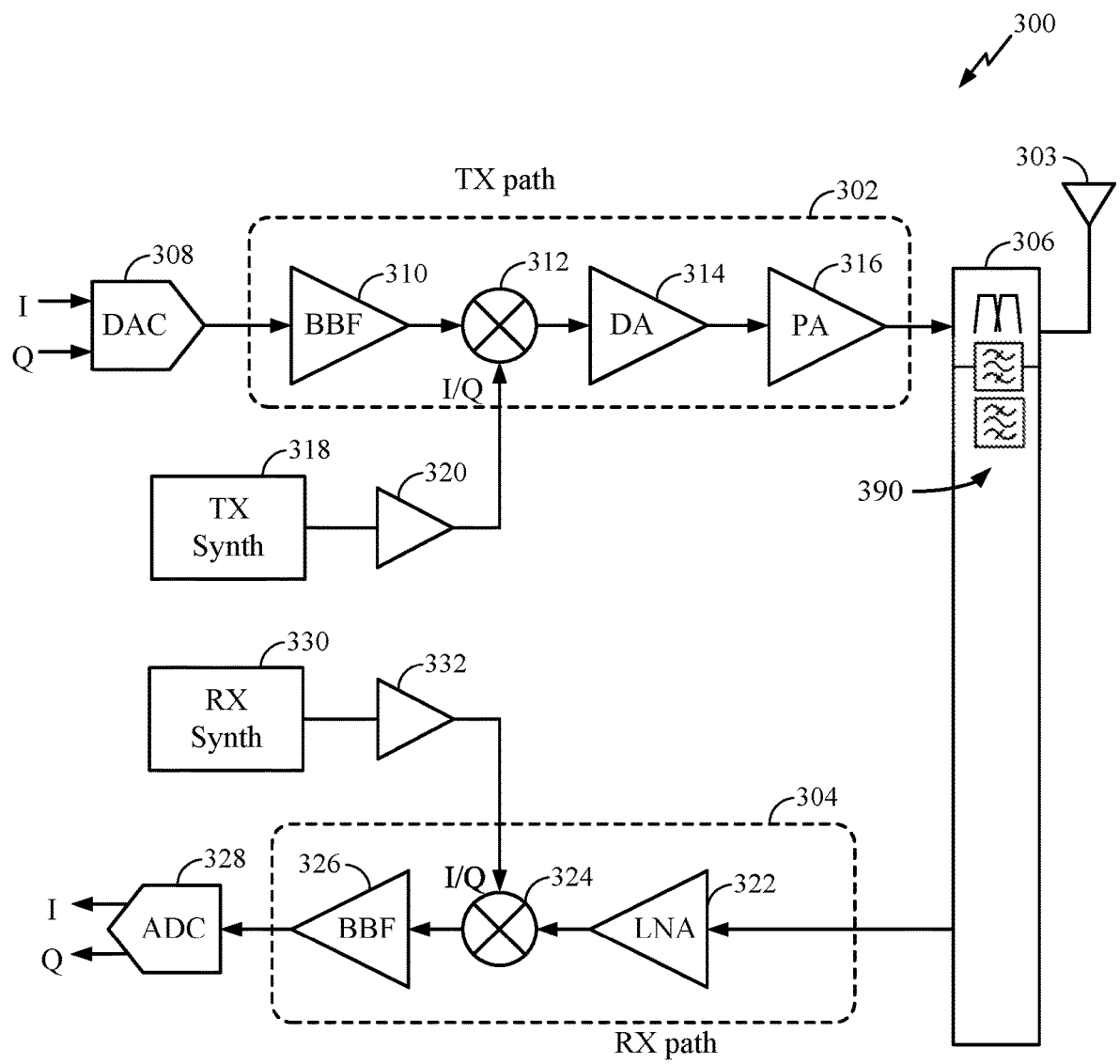
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306. In certain aspects, the interface 306 may include one or more filters 390 (e.g., forming a duplexer) implemented with a DMS as a shunt impedance element in combination with a filter implemented with a DMS as a series impedance element. In some aspects, the interface 306 may include one or more modules including the one or more filters 390.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which may involve compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

Example Dual Mode Structure Resonator Filter Circuit

Certain aspects of the present disclosure provide techniques for a filter circuit implemented with dual mode structure (DMS) resonators, as described in more detail herein. A filter implemented as a DMS generally refers to a resonator that leverages both first and second resonant modes for its frequency response. With the evolution of fifth generation (5G) communications, the number of supported mobile communication bands has generally increased, which has resulted in a higher number of filters and/or duplexers in each mobile device. Currently, some mobile devices may have as many as a hundred filter components (e.g., discrete filters, duplexers, and/or multiplexers). Such a high number of filter components may pose a challenge for devices with filters implemented therein to be smaller in size while still mitigating losses and attenuation to reduce data loss. One approach of reducing package size involves trading off filter performance for a smaller package. In other approaches, surface acoustic wave (SAW) filters may be implemented with external passive components (e.g., inductors, capacitors, etc.) to improve attenuation in high frequency ranges. These approaches may generally sacrifice size for performance, or performance for size, in filters. Accordingly, a filter package with a reduced size, while still managing losses and signal attenuation, is desired.

In certain aspects, a filter circuit may be implemented with a multi-element (e.g., 5 elements) filter having a DMS as a shunt impedance element in combination with a multi-element filter having a DMS as a series impedance element for current transfer. This kind of ladder design for a filter circuit implemented with a DMS provides improved transfer of signals as well as improved near-band attenuation. The structure of the filter implemented with a DMS may be compact, thus reducing the effective chip area taken up by the filter. Compared to approaches implemented with a SAW resonator as a shunt impedance element, the multi-element filter implemented with a DMS that is used as a shunt impedance element may allow for fewer acoustic elements to be used in the filter overall, allowing for decreased size without sacrificing performance.

Figure 4A:
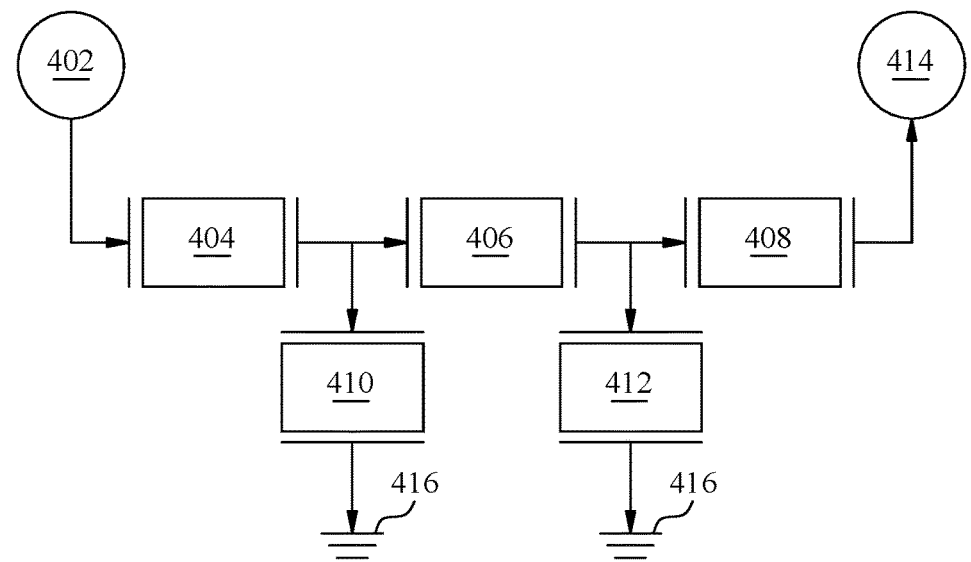
FIGS. 4A and 4B are schematic diagrams of filter circuits, in accordance with certain aspects of the present disclosure.

FIG. 4A is a schematic diagram of a filter circuit 400, in accordance with certain aspects of the present disclosure. The filter circuit 400 may include an input terminal 402 (also referred to as an "input port") and an output terminal 414 (also referred to as an "output port"). As shown, between the input terminal 402 and the output terminal 414 a ladder-type network of resonators (e.g., SAW resonators) may be provided. The filter circuit 400 may include a resonator 404, a resonator 406, and a resonator 408 electrically connected in a series path between the input terminal 402 and the output terminal 414. A resonator 410 (e.g., a shunt resonator) may have a first terminal connected to a node between the resonator 404 and the resonator 406 and a second terminal connected to a reference potential node 416 (e.g., electric ground). Moreover, a resonator 412 (e.g., a shunt resonator) may have a first terminal connected to a node between the resonator 406 and the resonator 408 and a second terminal connected to the reference potential node 416. The filter circuit 400 may, for example, be a bandpass circuit having a passband with a selected frequency range (e.g., on the order between 40 MHz and 3.5 GHz). In some cases, the filter circuit 400 may be implemented with only one series resonator (e.g., resonator 406) and one shunt resonator (e.g., resonator 410). Additional shunt and series resonators, such as resonators 404, 412, 408, may be implemented optionally in additional filter stages, for example, to increase a roll-off associated with a frequency response of the filter circuit 400. Furthermore, for certain aspects, the filter circuit 400 may be operated in reverse, such that the input port is terminal 414 and the output port is terminal 402.

Figure 4B:
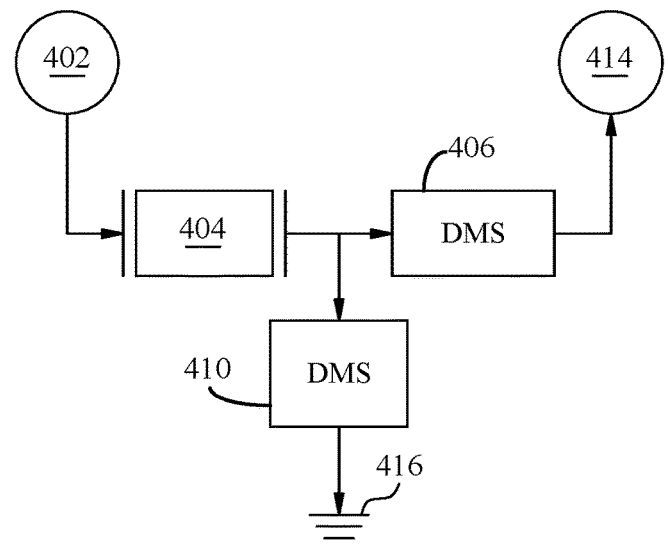

FIG. 4B is a schematic diagram of a filter circuit 401, in accordance with certain aspects of the present disclosure. The filter circuit 401 may include an input terminal 402 and an output terminal 414. As shown, between the input terminal 402 and the output terminal 414, a ladder-type network of resonators (e.g., SAW resonators) may be provided. As shown, the filter circuit 401 may include the resonators 404, 406, 410. In some aspects, the resonators 406, 410 may be implemented with a DMS, as illustrated.

Figure 5:
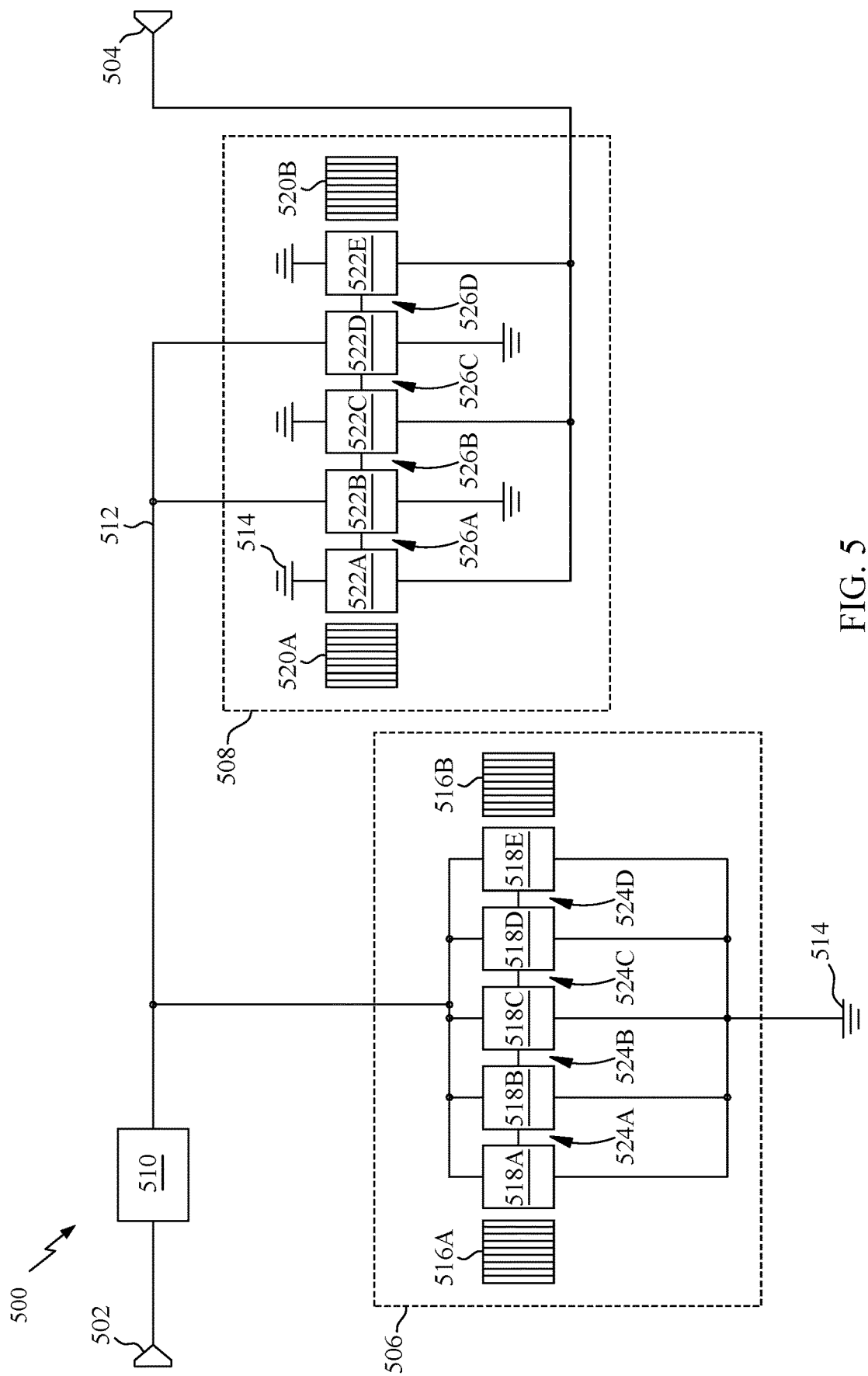
FIG. 5 is a schematic diagram of a filter circuit implemented with resonators having a dual mode structure (DMS), in accordance with certain aspects of the present disclosure.

FIG. 5 is a schematic diagram of a filter circuit 500 having resonators implemented with a dual mode structure (DMS), in accordance with certain aspects of the present disclosure. As shown, the filter circuit 500 may include a first port 502, a second port 504, a shunt resonator 506, a series resonator 508, and an acoustic element 510 (e.g., a resonator). As illustrated, the series resonator 508 may be coupled between the first port 502 and the second port 504, while the shunt resonator 506 may be coupled between a node 512 of the filter circuit 500 and a reference potential node 514. The acoustic element 510 may be coupled between the first port 502 and the node 512 of the filter circuit 500. In certain aspects, the acoustic element 510 may correspond to the resonator 404, as described with respect to FIG. 4. Additionally, the shunt resonator 506 may correspond to the resonator 410, and the series resonator 508 may correspond to the resonator 406. In some examples, resonator 412 may be implemented using a similar structure as the shunt resonator 506, and resonator 408 may be implemented using a similar structure as the series resonator 508.

In certain aspects, the shunt resonator 506 may be implemented with a DMS structure to provide dual resonance modes by including multiple interdigitated transducers (IDTs) between two reflectors. For example, shunt resonator 506 may include a plurality of IDTs 518A, 518B, 518C, 518D, 518E (collectively referred to as "IDTs 518") disposed between reflectors 516A, 516B (collectively referred to as "reflectors 516"). Furthermore, adjacent IDTs in the shunt resonator 506 may be electroacoustically coupled. For example, as illustrated, an electroacoustic coupling 524A may exist between the IDTs 518A, 518B (e.g., as shown by the line between the IDTs 518A and 518B), an electroacoustic coupling 524B may exist between the IDTs 518B, 518C, an electroacoustic coupling 524C may exist between the IDTs 518C, 518D, and an electroacoustic coupling 524D may exist between the IDTs 518D, 518E. In some aspects, the electroacoustic coupling may correspond to a spacing or gap between IDTs (e.g., between 518A and 518B) that share a piezoelectric substrate. Although 5 IDTs are shown in the shunt resonator 506 to implement a 5-element filter having a DMS, the shunt resonator 506 may include two, three, four, or more than five IDTs.

The shunt resonator 506 may be configured to set a band-stop frequency range associated with the filter circuit 500. By implementing the shunt resonator 506 using a DMS, a size of the filter circuit 500 may be reduced while providing improved attenuation in the band-stop frequency range, as compared to conventional implementations.

In certain aspects, each of the IDTs 518 may have the same resonant frequency. Alternatively, at least some of the IDTs 518 may have different resonant frequencies. For example, the IDT 518A may have a different resonant frequency than the IDT 518B. As another example, some of the IDTs 518 may have the same frequency, while the rest of the IDTs 518 may have another, different frequency.

Figure 6A:
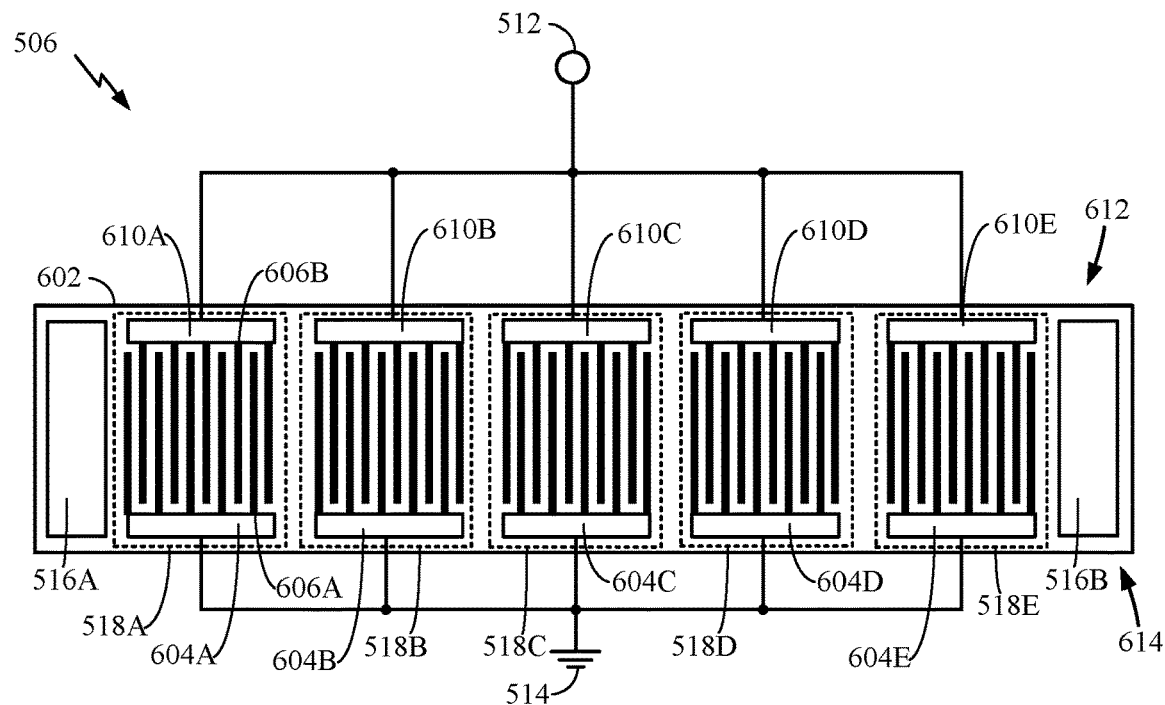
FIGS. 6A and 6B are diagrams of example resonators implemented as a DMS, in accordance with certain aspects of the present disclosure.

FIG. 6A illustrates an example implementation of the shunt resonator 506, in accordance with certain aspects of the present disclosure. As illustrated, each of the IDTs 518 of the shunt resonator 506 may be coupled between the node 512 and the reference potential node 514, and may be spaced apart, as shown. Moreover, each of the IDTs 518 and the reflectors 516 may be disposed above a piezoelectric substrate 602. As illustrated, each of the IDTs 518 (e.g., the IDT 518A) of the shunt resonator 506 may include electrode structures (e.g., electrode structures 606A, 606B) with electrode fingers extending from two busbars (e.g., busbars 604A, 610A) towards each other arranged in an interlocking manner (e.g., arranged in an interdigitated manner). The busbar 610A may electrically couple the node 512 to the electrode structure 606B, and the busbar 604A may electrically couple the reference potential node 514 to the electrode structure 606A. As shown, the electrode fingers extending from each of the busbars may not touch the opposite busbar. As shown, each of the IDTs 518B-E may have a similar structure and connections as the IDT 518A. That is, the IDT 518B may include busbars 604B, 610B, the IDT 518C may include busbars 604C, 610C, the IDT 518D may include busbars 604D, 610D, and the IDT 518E may include busbars 604E, 610E. As shown, each of the busbars 610A, 610B, 610C, 610D, 610E may be disposed adjacent to the side 612 of the piezoelectric substrate 602 and coupled to the node 512. Furthermore, each of the busbars 604A, 604B, 604C, 604D, 604E may be disposed adjacent to the side 614 of the piezoelectric substrate 602 and coupled to the reference potential node 514. The sides 612, 614 may be opposite sides of the piezoelectric substrate 602.

An electrical signal applied to the IDTs 518 may be transformed into an acoustic wave (namely, a surface acoustic wave) that propagates in a particular direction via the piezoelectric substrate 602. The acoustic wave may then be transformed back into an electrical signal and provided to node 512 for the shunt resonator 506.

In some applications, the piezoelectric substrate 602 may have a particular crystal orientation such that when the IDTs 518 are arranged relative to the crystal orientation of the piezoelectric substrate 602, the acoustic wave may propagate in a direction perpendicular to the direction of the fingers (e.g., parallel to the busbars 604A, 610A, from one IDT to an adjacent IDT). The reflectors 516 may reflect the acoustic wave back towards the IDTs 518 for the conversion of the acoustic wave into an electrical signal via the IDTs 518 in the configuration shown and to prevent losses (e.g., confine and prevent escaping acoustic waves). Each reflector 516 may have two busbars and a grating structure of conductive fingers that each connect to both busbars (not shown in FIG. 6A, but shown in FIG. 5). The pitch of the reflectors 516 may be similar to or the same as the pitch of the IDTs 518 to reflect acoustic waves in the resonant frequency range of the shunt resonator 506.

Referring back to FIG. 5, the series resonator 508 may include a plurality of IDTs 522A, 522B, 522C, 522D, 522E (collectively referred to as "IDTs 522") disposed between reflectors 520A, 520B (collectively referred to as "reflectors 520"). Furthermore, adjacent IDTs in the series resonator 508 may be electroacoustic coupled. For example, as illustrated, an electroacoustic coupling 526A may exist between the IDTs 522A, 522B, an electroacoustic coupling 526B may exist between the IDTs 522B, 522C, an electroacoustic coupling 526C may exist between the IDTs 522C, 522D, and an electroacoustic coupling 526D may exist between the IDTs 522D, 522E. In some aspects, the electroacoustic coupling may correspond to a spacing or gap between the IDTs that share a piezoelectric substrate wherein acoustic wave propagating in the piezoelectric material may interact each of the IDTs. Although 5 IDTs are shown in the series resonator 508, the shunt resonator may include two, three, four, or more than five IDTs. Moreover, the series resonator 508 may be implemented with a DMS (e.g., in a similar fashion as the shunt resonator 506). In some examples, the series resonator 508 may be configured to set a bandpass frequency range associated with the filter circuit 500.

Figure 6B:
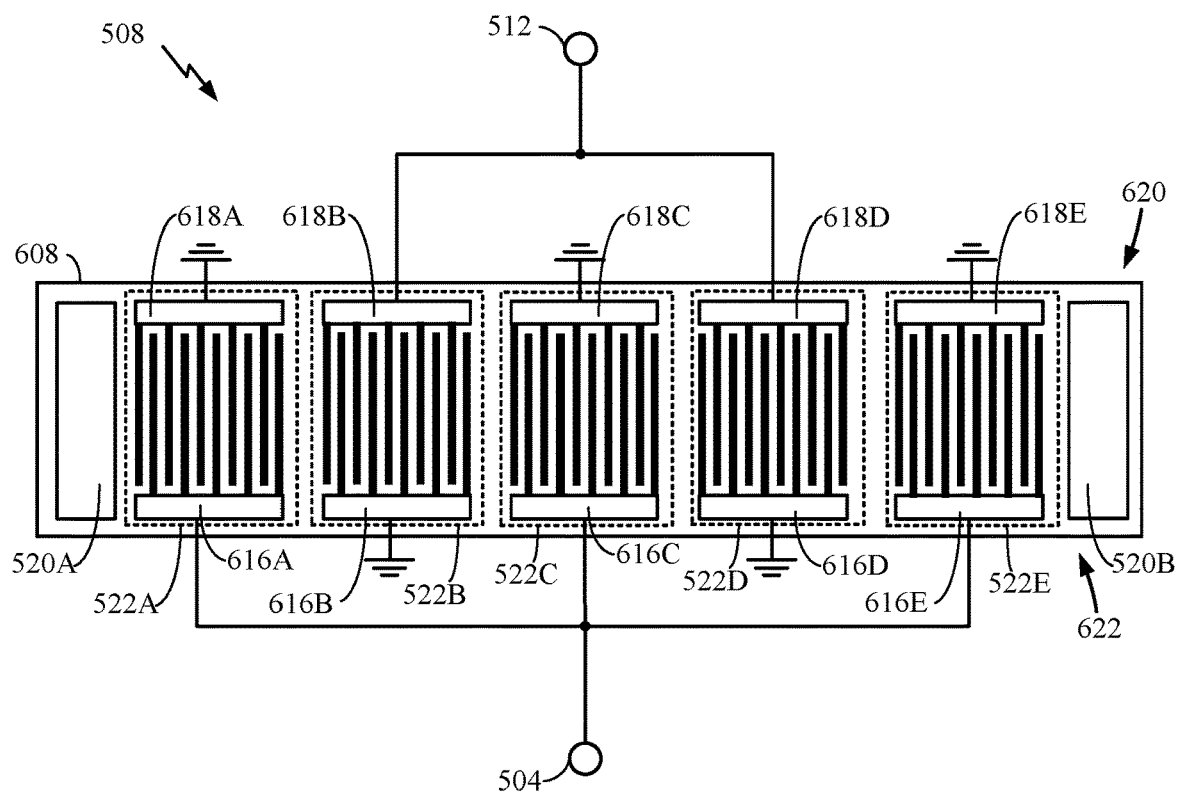

FIG. 6B illustrates an example implementation of the series resonator 508, in accordance with certain aspects of the present disclosure. Each of the IDTs 522 of the series resonator 508 may be coupled between either the node 512 and the reference potential node 514 or the reference potential node 514 and the second port 504 (e.g., in alternating fashion). For example, the IDTs 522B, 522D may be coupled between the node 512 and the reference potential node 514, while the IDTs 522A, 522C, 522E may be coupled between the reference potential node 514 and the second port 504. Moreover, each of the IDTs 522 and the reflectors 520 may be disposed above a piezoelectric substrate 608.

As illustrated, the IDT 522A may include busbars 616A, 618A, the IDT 522B may include busbars 616B, 618B, the IDT 522C may include busbars 616C, 618C, the IDT 522D may include busbars 616D, 618D, and the IDT 522E may include busbars 616E, 618E. Each of the IDTs 522 may include interdigitated fingers between busbars of the IDT. As shown, each of the busbars 618A, 618B, 618C, 618D, 618E may be disposed adjacent to side 620 of the piezoelectric substrate 608, and each of the busbars 616A, 616B, 616C, 616D, 616E may be disposed adjacent to side 622 piezoelectric substrate 608, the sides 620, 622 being opposite sides of the piezoelectric substrate 608. Furthermore, the busbars 618A, 618C, 618E, 616B, 616D may be coupled to the reference potential node 514. The busbars 618B, 618D may be coupled to the node 512, and the busbars 616A, 616C, 616E may be coupled to the second port 504.

Figure 6C:
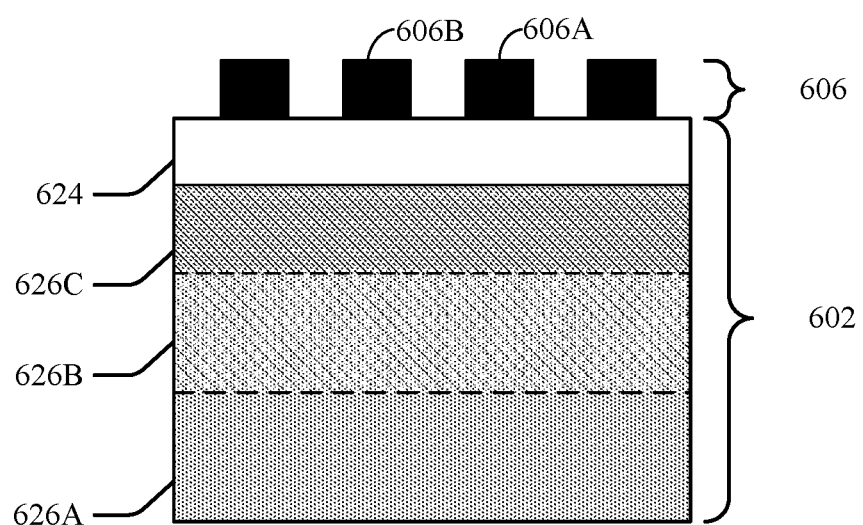
FIG. 6C is a diagram of a side view of the resonators of FIGS. 6A and 6B, in accordance with certain aspects of the present disclosure.

FIG. 6C is a side view of an example filter having an IDT (e.g., corresponding to any one of IDTs 518, 522 of FIGS. 6A and 6B), in accordance with certain aspects of the present disclosure. In the example shown in FIG. 6C, the piezoelectric substrate 602 may include sublayers such as a substrate sublayer 626A (e.g., of silicon). The piezoelectric substrate 602 may further include a trap rich layer 626B (e.g., poly-silicon). The piezoelectric substrate 602 may further include a compensation layer 626C (e.g., silicon dioxide ($SiO_2$) or another suitable dielectric material) that may provide temperature compensation and/or other properties. These sublayers may be considered part of the piezoelectric substrate 602 or their own separate layers. As shown, a piezoelectric material 624 is a top layer of the piezoelectric substrate 602 with a particular thickness for providing a particular acoustic wave mode. The electrode structures 606 are positioned above the piezoelectric material 624. For example, as shown, the electrode structures 606 may correspond to the electrode structures 606A and 606B of the IDT 518A of FIG. 6A. In addition, in some aspects, there may be one or more layers (not shown) above the electrode structures 606 (e.g., a thin passivation layer). In some aspects, the sublayers may not be present and the piezoelectric layer may remain as a bulk substrate layer.

Figure 7:
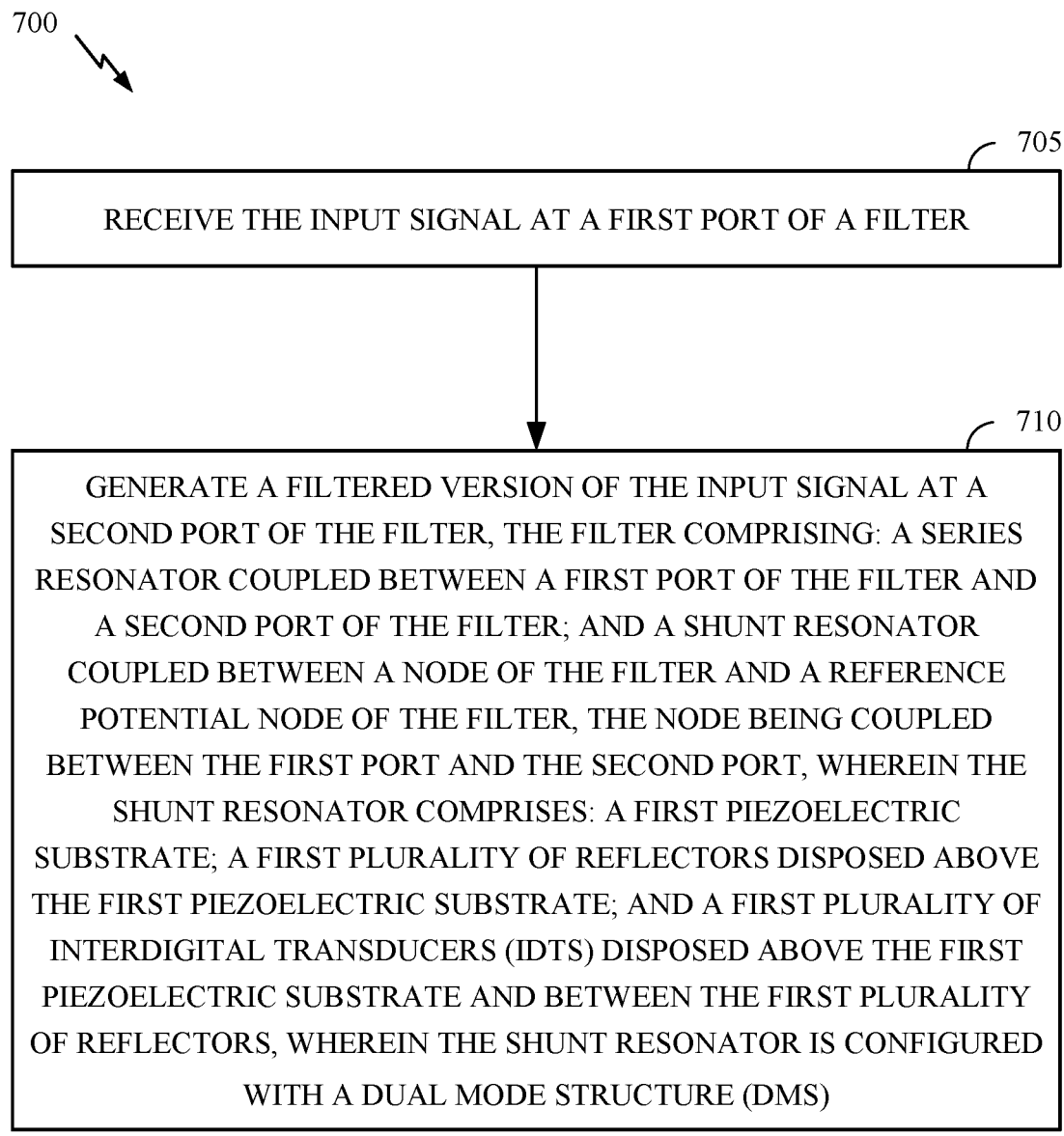
FIG. 7 is a flow diagram depicting example operations for filtering a signal, in accordance with certain aspects of the present disclosure.

FIG. 7 is a flow diagram depicting example operations 700 for filtering an input signal, in accordance with certain aspects of the present disclosure. For example, the operations 700 may be performed by a filter, such as the filter circuit 400 of FIG. 4 or filter circuit 500 of FIG. 5.

The operations 700 begin, at block 705, with the filter receiving the input signal at a first port (e.g., the first port 502) of the filter. At block 710, the filter circuit generates a filtered version of the input signal at a second port (e.g., the second port 504) of the filter. The filter may include a series resonator (e.g., the series resonator 508) coupled between the first port of the filter and the second port of the filter, and a shunt resonator (e.g., the shunt resonator 506) coupled between a node (e.g., the node 512) of the filter and a reference potential node (e.g., the reference potential node 514) of the filter, the node being coupled between the first port and the second port, where the shunt resonator is configured as a DMS.

In some aspects, the shunt resonator may include a first piezoelectric substrate (e.g., the piezoelectric substrate 602), a first plurality of reflectors (e.g., the reflectors 516) disposed above the first piezoelectric substrate, and a first plurality of interdigital transducers (IDTs) (e.g., the IDTs 518) disposed above the first piezoelectric substrate and between the first plurality of reflectors. In some cases, an adjacent pair of IDTs (e.g., IDTs 518A, 518B) in the first plurality of IDTs of the shunt resonator are electrostatically coupled.

In certain aspects, the shunt resonator may be configured as a DMS or the series resonator may be configured as a DMS. In some examples, the shunt resonator may be configured to set a band-stop frequency range associated with the filter.

In certain aspects, each of the first plurality of IDTs may be coupled between the node and the reference potential node. In certain aspects, the series resonator may include a second piezoelectric substrate (e.g., the piezoelectric substrate 608), a second plurality of reflectors (e.g., the reflectors 520) on the second piezoelectric substrate, and a second plurality of IDTs (e.g., the IDTs 522) on the second piezoelectric substrate, the second plurality of IDTs being disposed between the second plurality of reflectors. In this case, at least one of the second plurality of IDTs may be coupled between the first port and the reference potential node, and at least one other of the second plurality of IDTs may be coupled between the reference potential node and the second port.

Furthermore, in certain aspects, at least two of the second plurality of IDTs may be coupled between the first port and the reference potential node, and another one of the second plurality of IDTs may be coupled between the reference potential node and the second port, the other one of the second plurality of IDTs being disposed between the at least two of the second plurality of IDTs. In certain aspects, the series resonator may be configured to set a bandpass frequency range associated with the filter.

In some examples, the filter may include an acoustic element (e.g., the acoustic element 510) coupled between the first port and the second port. For example, the acoustic element may be a resonator.

In certain aspects, each of the first plurality of IDTs may have the same resonant frequency. In some cases, a first IDT of the first plurality of IDTs may have a different resonant frequency than a second IDT of the first plurality of IDTs.

In certain aspects, the filter may include another shunt resonator (e.g., resonator 412) coupled between another node of the filter and the reference potential node of the filter, the other node being coupled between the first port and the second port. The other shunt resonator may include a second piezoelectric substrate, a second plurality of reflectors disposed above the second piezoelectric substrate, and a second plurality of IDTs disposed above the second piezoelectric substrate and between the second plurality of reflectors. In some cases, the other shunt resonator may be configured as a DMS.

Example Aspects

Aspect 1. A filter comprising: a series resonator coupled between a first port of the filter and a second port of the filter; and a shunt resonator coupled between a node of the filter and a reference potential node of the filter, the node being coupled between the first port and the second port, wherein the shunt resonator comprises: a first piezoelectric substrate; a first plurality of reflectors disposed above the first piezoelectric substrate; and a first plurality of interdigital transducers (IDTs) disposed above the first piezoelectric substrate and between the first plurality of reflectors, wherein the shunt resonator is configured as a dual mode structure (DMS).

Aspect 2. The filter of aspect 1, wherein a frequency response of the shunt resonator is based on a first resonant mode and a second resonant mode of the shunt resonator.

Aspect 3. The filter of any one of aspects 1-2, wherein each of the first plurality of IDTs is coupled between the node and the reference potential node.

Aspect 4. The filter of any one of aspects 1-3, wherein the series resonator comprises: a second piezoelectric substrate; a second plurality of reflectors on the second piezoelectric substrate; and a second plurality of IDTs on the second piezoelectric substrate, the second plurality of IDTs being disposed between the second plurality of reflectors.

Aspect 5. The filter of aspect 4, wherein the second piezoelectric substrate is the same as the first piezoelectric substrate.

Aspect 6. The filter of any one of aspects 4-5, wherein: at least one of the second plurality of IDTs is coupled between the first port and the reference potential node; and at least one other of the second plurality of IDTs is coupled between the reference potential node and the second port.

Aspect 7. The filter of any one of aspects 4-6, wherein: at least two of the second plurality of IDTs is coupled between the first port and the reference potential node; and another one of the second plurality of IDTs is coupled between the reference potential node and the second port, the other one of the second plurality of IDTs being disposed between the at least two of the second plurality of IDTs.

Aspect 8. The filter of any one of aspects 1-7, further comprising an acoustic element coupled between the first port and the second port.

Aspect 9. The filter of aspect 8, wherein the acoustic element comprises a resonator.

Aspect 10. The filter of any one of aspects 1-9, wherein the shunt resonator is configured to set a band-stop frequency range associated with the filter.

Aspect 11. The filter of any one of aspects 1-10, wherein the series resonator is configured to set a bandpass frequency range associated with the filter.

Aspect 12. The filter of any one of aspects 1-11, wherein the series resonator is configured as a dual mode structure (DMS).

Aspect 13. The filter of any one of aspects 1-12, wherein an adjacent pair of IDTs in the first plurality of IDTs of the shunt resonator are electroacoustically coupled.

Aspect 14. The filter of any one of aspects 1-13, wherein each of the first plurality of IDTs has a same resonant frequency.

Aspect 15. The filter of any one of aspects 1-14, wherein a first IDT of the first plurality of IDTs has a different resonant frequency than a second IDT of the first plurality of IDTs.

Aspect 16. The filter of any one of aspects 1-15, further comprising another shunt resonator coupled between another node of the filter and the reference potential node of the filter, the other node being coupled between the first port and the second port, wherein the other shunt resonator comprises: a second piezoelectric substrate; a second plurality of reflectors disposed above the second piezoelectric substrate; and a second plurality of IDTs disposed above the second piezoelectric substrate and between the second plurality of reflectors.

Aspect 17. The filter of aspect 16, wherein the other shunt resonator is configured as a dual mode structure (DMS).

Aspect 18. The filter of any one of aspects 1-17, wherein the first plurality of IDTs comprises at least 3 IDTs.

Aspect 19. The filter of any one of aspects 1-18, wherein the first plurality of IDTs comprises at least 5 IDTs.

Aspect 20. A filter comprising: a series resonator coupled between a first port of the filter and a second port of the filter; and a shunt resonator coupled between a node of the filter and a reference potential node of the filter, the node being coupled between the first port and the second port, wherein the shunt resonator is configured as a dual mode structure (DMS).

Aspect 21. The filter of aspect 20, wherein a frequency response of the shunt resonator is based on a first resonant mode and a second resonant mode of the shunt resonator.

Aspect 22. The filter of any one of aspects 20-21, further comprising an acoustic element coupled between the first port and the second port.

Aspect 23. The filter of aspect 22, wherein the acoustic element comprises a resonator.

Aspect 24. The filter of any one of aspects 20-23, wherein the shunt resonator is configured to set a band-stop frequency range associated with the filter.

Aspect 25. The filter of any one of aspects 20-24, wherein the series resonator is configured to set a bandpass frequency range associated with the filter.

Aspect 26. The filter of any one of aspects 20-25, wherein the series resonator is configured as a dual mode structure (DMS).

Aspect 27. The filter of any one of aspects 20-26, further comprising another shunt resonator coupled between another node of the filter and the reference potential node of the filter, the other node being coupled between the first port and the second port.

Aspect 28. The filter of aspect 27, wherein the other shunt resonator is configured as a dual mode structure (DMS).

Aspect 29. A method for filtering an input signal, comprising: receiving the input signal at a first port of a filter; and generating a filtered version of the input signal at a second port of the filter, the filter comprising: a series resonator coupled between the first port of the filter and the second port of the filter; and a shunt resonator coupled between a node of the filter and a reference potential node of the filter, the node being coupled between the first port and the second port, wherein the shunt resonator comprises: a first piezoelectric substrate; a first plurality of reflectors disposed above the first piezoelectric substrate; and a first plurality of interdigital transducers (IDTs) disposed above the first piezoelectric substrate and between the first plurality of reflectors, wherein the shunt resonator is configured as a dual mode structure (DMS).

Aspect 30. The method of aspect 29, wherein the series resonator is configured as a dual mode structure (DMS).

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A filter comprising:
a series resonator coupled between a first port of the filter and a second port of the filter; and
a shunt resonator coupled between a node of the filter and a reference potential node of the filter, the node being coupled between the first port and the second port, wherein the shunt resonator comprises:
a first piezoelectric substrate;
a first plurality of reflectors disposed above the first piezoelectric substrate; and
a first plurality of interdigital transducers (IDTs) disposed above the first piezoelectric substrate and between the first plurality of reflectors, wherein the shunt resonator is configured as a dual mode structure (DMS).

2. The filter of claim 1, wherein a frequency response of the shunt resonator is based on a first resonant mode and a second resonant mode of the shunt resonator.

3. The filter of claim 1, wherein each of the first plurality of IDTs is coupled between the node and the reference potential node.

4. The filter of claim 1, wherein the series resonator comprises:
a second piezoelectric substrate;
a second plurality of reflectors on the second piezoelectric substrate; and
a second plurality of IDTs on the second piezoelectric substrate, the second plurality of IDTs being disposed between the second plurality of reflectors.

5. The filter of claim 4, wherein the second piezoelectric substrate is the same as the first piezoelectric substrate.

6. The filter of claim 4, wherein:
at least one of the second plurality of IDTs is coupled between the first port and the reference potential node; and
at least one other of the second plurality of IDTs is coupled between the reference potential node and the second port.

7. The filter of claim 4, wherein:
at least two of the second plurality of IDTs is coupled between the first port and the reference potential node; and
another one of the second plurality of IDTs is coupled between the reference potential node and the second port, the other one of the second plurality of IDTs being disposed between the at least two of the second plurality of IDTs.

8. The filter of claim 1, further comprising an acoustic element coupled between the first port and the second port.

9. The filter of claim 8, wherein the acoustic element comprises a resonator.

10. The filter of claim 1, wherein the shunt resonator is configured to set a band-stop frequency range associated with the filter.

11. The filter of claim 1, wherein the series resonator is configured to set a bandpass frequency range associated with the filter.

12. The filter of claim 1, wherein the series resonator is configured as a dual mode structure (DMS).

13. The filter of claim 1, wherein an adjacent pair of IDTs in the first plurality of IDTs of the shunt resonator are electroacoustically coupled.

14. The filter of claim 1, wherein each of the first plurality of IDTs has a same resonant frequency.

15. The filter of claim 1, wherein a first IDT of the first plurality of IDTs has a different resonant frequency than a second IDT of the first plurality of IDTs.

16. The filter of claim 1, further comprising another shunt resonator coupled between another node of the filter and the reference potential node of the filter, the other node being coupled between the first port and the second port, wherein the other shunt resonator comprises:
a second piezoelectric substrate;
a second plurality of reflectors disposed above the second piezoelectric substrate; and
a second plurality of IDTs disposed above the second piezoelectric substrate and between the second plurality of reflectors.

17. The filter of claim 16, wherein the other shunt resonator is configured as a dual mode structure (DMS).

18. The filter of claim 1, wherein the first plurality of IDTs comprises at least 3 IDTs.

19. The filter of claim 1, wherein the first plurality of IDTs comprises at least 5 IDTs.

20. A filter comprising:
a series resonator coupled between a first port of the filter and a second port of the filter; and
a shunt resonator coupled between a node of the filter and a reference potential node of the filter, the node being coupled between the first port and the second port, wherein the shunt resonator is configured as a dual mode structure (DMS).

21. The filter of claim 20, wherein a frequency response of the shunt resonator is based on a first resonant mode and a second resonant mode of the shunt resonator.

22. The filter of claim 20, further comprising an acoustic element coupled between the first port and the second port.

23. The filter of claim 22, wherein the acoustic element comprises a resonator.

24. The filter of claim 20, wherein the shunt resonator is configured to set a band-stop frequency range associated with the filter.

25. The filter of claim 20, wherein the series resonator is configured to set a bandpass frequency range associated with the filter.

26. The filter of claim 20, wherein the series resonator is configured as a dual mode structure (DMS).

27. The filter of claim 20, further comprising another shunt resonator coupled between another node of the filter and the reference potential node of the filter, the other node being coupled between the first port and the second port.

28. The filter of claim 27, wherein the other shunt resonator is configured as a dual mode structure (DMS).

29. A method for filtering an input signal, comprising:
receiving the input signal at a first port of a filter; and
generating a filtered version of the input signal at a second port of the filter, the filter comprising:
a series resonator coupled between the first port of the filter and the second port of the filter; and
a shunt resonator coupled between a node of the filter and a reference potential node of the filter, the node being coupled between the first port and the second port, wherein the shunt resonator comprises:
a first piezoelectric substrate;
a first plurality of reflectors disposed above the first piezoelectric substrate; and
a first plurality of interdigital transducers (IDTs) disposed above the first piezoelectric substrate and between the first plurality of reflectors, wherein the shunt resonator is configured as a dual mode structure (DMS).

30. The method of claim 29, wherein the series resonator is configured as a dual mode structure (DMS).

* * * * *